(12) United States Patent
Won

(10) Patent No.: US 9,847,118 B1
(45) Date of Patent: Dec. 19, 2017

(54) MEMORY DEVICE AND METHOD FOR OPERATING THE SAME

(71) Applicant: SK hynix Inc., Gyeonggi-do (KR)

(72) Inventor: Hyung-Sik Won, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/386,082

(22) Filed: Dec. 21, 2016

(30) Foreign Application Priority Data

Jul. 12, 2016 (KR) ........................ 10-2016-0088089

(51) Int. Cl.
*G11C 8/10* (2006.01)
*G11C 11/406* (2006.01)

(52) U.S. Cl.
CPC ................... *G11C 11/406* (2013.01)

(58) Field of Classification Search
CPC .......... G11C 11/06; G11C 8/10; G11C 11/064
USPC ............................................. 365/222, 230.06
See application file for complete search history.

(56) References Cited

U.S. PATENT DOCUMENTS

| 5,251,168 | A | 10/1993 | Chung et al. | |
|---|---|---|---|---|
| 6,005,803 | A * | 12/1999 | Kuo ...................... | G11C 16/08 365/185.11 |
| 6,275,894 | B1 * | 8/2001 | Kuo ...................... | G11C 16/08 365/185.11 |
| 9,123,389 | B1 * | 9/2015 | Park ...................... | G11C 11/406 |
| 9,432,298 | B1 * | 8/2016 | Smith ................... | H04L 49/9057 |
| 2002/0114209 | A1 * | 8/2002 | Koyanagi .............. | G11C 8/12 365/230.03 |
| 2006/0083091 | A1 * | 4/2006 | Edahiro ................ | G11C 7/12 365/203 |
| 2007/0030729 | A1 * | 2/2007 | Chan .................... | G11C 16/28 365/185.2 |
| 2008/0049532 | A1 * | 2/2008 | Kajigaya ............... | G11C 8/12 365/222 |
| 2009/0268543 | A1 * | 10/2009 | Chen .................... | G11C 7/1006 365/230.02 |
| 2009/0296510 | A1 * | 12/2009 | Lee ...................... | G11C 11/406 365/222 |
| 2010/0027363 | A1 * | 2/2010 | Li ........................ | G06F 13/1636 365/222 |
| 2010/0081395 | A1 * | 4/2010 | Woo .................... | H01L 27/0207 455/73 |
| 2010/0332729 | A1 * | 12/2010 | Alrod ................... | G06F 11/1068 711/103 |
| 2011/0007594 | A1 * | 1/2011 | Kim ...................... | G11C 11/406 365/222 |
| 2011/0026348 | A1 * | 2/2011 | Narui .................... | G11C 7/227 365/210.1 |
| 2011/0069572 | A1 * | 3/2011 | Lee ...................... | G11C 11/406 365/222 |
| 2011/0205797 | A1 * | 8/2011 | Kim .................... | G11C 16/0483 365/185.11 |

(Continued)

*Primary Examiner* — Michael Tran
(74) *Attorney, Agent, or Firm* — IP & T Group LLP

(57) ABSTRACT

A memory device may include: a cell array comprising a main area and an adjacent area with a plurality of main memory cells disposed in the main area and a plurality of adjacent memory cells disposed in the adjacent area; a control circuit suitable for controlling a row operation and column operation of the cell array; and an adjacent area controller suitable for controlling adjacent memory cells so that the adjacent memory cells are operated under a different condition from the main memory cells.

20 Claims, 10 Drawing Sheets

(56) References Cited

U.S. PATENT DOCUMENTS

| | | | | |
|---|---|---|---|---|
| 2012/0263003 | A1* | 10/2012 | Sakakibara | G11C 11/40615 365/222 |
| 2013/0051171 | A1* | 2/2013 | Porter | G11C 8/08 365/222 |
| 2014/0133217 | A1* | 5/2014 | Lee | G11C 11/412 365/154 |
| 2014/0177358 | A1* | 6/2014 | Moon | G11C 7/1006 365/189.17 |
| 2014/0321190 | A1* | 10/2014 | Shepard | G11C 13/0004 365/94 |
| 2014/0347937 | A1* | 11/2014 | Lee | G11C 16/0483 365/185.19 |
| 2015/0155016 | A1* | 6/2015 | Ku | G11C 8/12 365/203 |
| 2015/0170729 | A1* | 6/2015 | Schaefer | G11C 8/12 365/230.02 |
| 2015/0193158 | A1* | 7/2015 | Yoon | G06F 3/0619 711/103 |
| 2016/0005452 | A1 | 1/2016 | Bae et al. | |
| 2016/0049197 | A1* | 2/2016 | Park | G11C 13/0069 365/148 |
| 2016/0049201 | A1* | 2/2016 | Lue | G11C 16/0483 365/185.11 |
| 2016/0055896 | A1* | 2/2016 | Lim | G11C 11/408 365/149 |
| 2016/0276331 | A1* | 9/2016 | Liaw | H01L 27/1124 |

\* cited by examiner

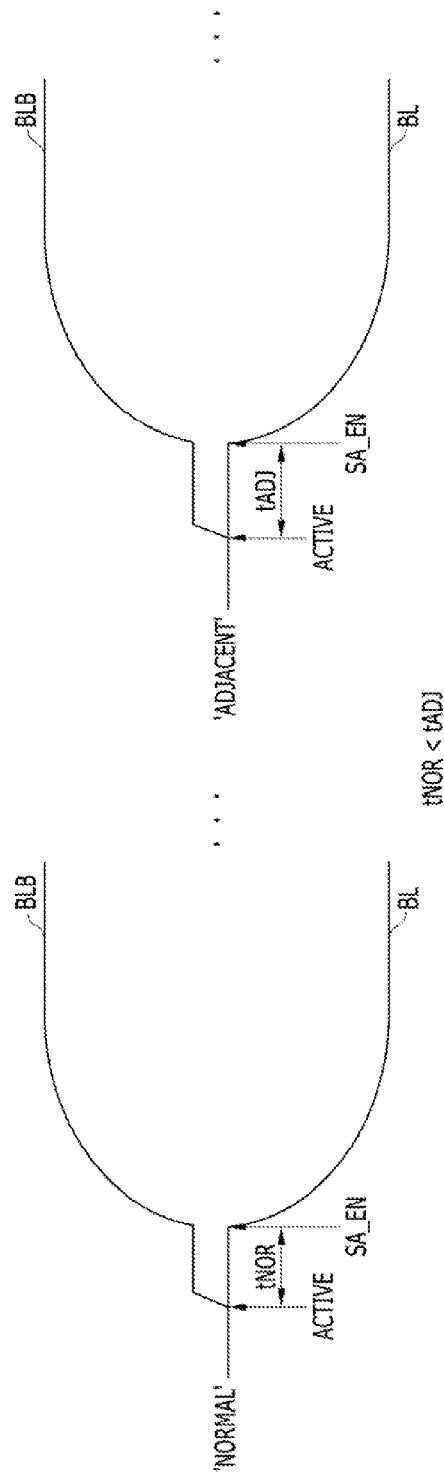

MEMORY DEVICE AND METHOD FOR OPERATING THE SAME

CROSS-REFERENCE TO RELATED APPLICATIONS

This U.S. non-provisional patent application claims priority under 35 U.S.C. §119(a) to Korean Patent Application No. 10-2016-0088089, filed on Jul. 12, 2016 in the Korean Intellectual Property Office (KIPO), the disclosure of which is incorporated herein by reference in its entirety.

BACKGROUND

1. Field

Embodiments of the present invention relate to a memory device and a method for operating the same.

2. Description of the Related Art

A memory cell of a semiconductor memory device such as a Dynamic Random Access Memory (DRAM) includes a transistor serving as a switch and a capacitor for storing a charge (data). According to whether a charge is stored in the memory cell, that is, whether the terminal voltage of the capacitor is high or low, the data stored in the memory cell may be high logic (1) or low logic (0).

Storing the data requires maintaining the charge in the capacitor. However, due to leakage current caused by a PN junction of a MOS transistor, the initial charge stored in the capacitor may degrade over time and eventually disappear. Thus, the data may be lost. To prevent such a data loss, the data stored in a memory cell are read before the data are lost, and the memory cell is recharged according to the read information. Such an operation is typically repeated periodically for retaining the data and is referred to as a refresh operation.

Typically, a refresh operation is performed whenever a refresh command is inputted to a memory from a memory controller. Considering the data retention time of the memory, the memory controller inputs the refresh command to the memory at predetermined time intervals. For example, when the data retention time of the memory is 64 ms and the entire memory cells of the memory can be refreshed only in case the refresh command is inputted 8,000 times, the memory controller inputs 8,000 refresh commands to the memory device during each period of 64 ms.

Furthermore, when the data retention times of some memory cells included in a memory device do not exceed a defined reference time during a test process of the memory device the memory device is processed as a fail and the memory device is discarded. This of course results in lower yield in the manufacturing process the memory devices.

Furthermore, even a memory device which has passed an initial quality test may cause an error when a weak cell occurs due to a post manufacturing cause.

As the number of cells integrated in a single chip has increased to tens of millions or more, the possibility that a weak cell will occur has also increased despite improvements in the fabrication process. Unless an accurate test is performed on such a weak cell, the reliability of the semiconductor memory device cannot be secured. Thus, research is being conducted to develop improved devices and methods for detecting a weak cell.

SUMMARY

Various embodiments of the present invention are directed to a memory device capable of reducing an error by operating memory cells of an adjacent area under a different condition from the remaining memory cells of the main area of the memory cell array, and a method for controlling the same.

In an embodiment, a memory device may include: a cell array comprising a main area and an adjacent area with a plurality of main memory cells disposed in the main area and a plurality of adjacent memory cells disposed in the adjacent area; a control circuit suitable for controlling a row operation and column operation of the cell array; and an adjacent area controller suitable for controlling adjacent memory cells so that the adjacent memory cells are operated under a different condition from the main memory cells.

In an embodiment, a memory device may include: a cell array comprising a plurality of sub cell arrays arranged in a matrix shape; a control circuit suitable for controlling a row operation and column operation of the cell array; and an adjacent area controller suitable for controlling all or part of memory cells included in sub cell arrays arranged in an area adjacent to the control circuit among the sub cell arrays, such that all or part of the memory cells are operated under a different condition from memory cells included in the other sub cell arrays.

In an embodiment, there is provided a method for operating a memory device which includes a cell array including a plurality of memory cells and a control circuit for controlling a row operation and column operation of the cell array. The method may include: storing addresses of memory cells arranged in an area adjacent to the control circuit among the plurality of memory cells; and controlling the memory cells arranged in the area adjacent to the control circuit, so that the memory cells are operated under a different condition from the remaining memory cells of the memory cell array.

In an embodiment of the present invention, a memory device may include: a cell array including a plurality of first and second memory cells; a control circuit configured to control a row operation and column operation of the cell array; and an adjacent area controller configured to control the plurality of second memory cells, so that the plurality of second memory cells are operated under a different condition from the plurality of first memory cells, wherein the plurality of second memory cells are disposed between the control circuit and the plurality of first memory cells.

BRIEF DESCRIPTION OF THE DRAWINGS

The above and other features and advantages of the present invention will become apparent to those skilled in the art by the following detailed description with reference to the attached drawings in which:

FIGS. 4A to 4C are timing diagrams describing an operation for controlling memory cells of an adjacent area to be sensed at a later point of time than the remaining memory cells of the main area of the memory cell array of a memory device, in accordance with a second embodiment of the present invention;

DETAILED DESCRIPTION

Figure 1:
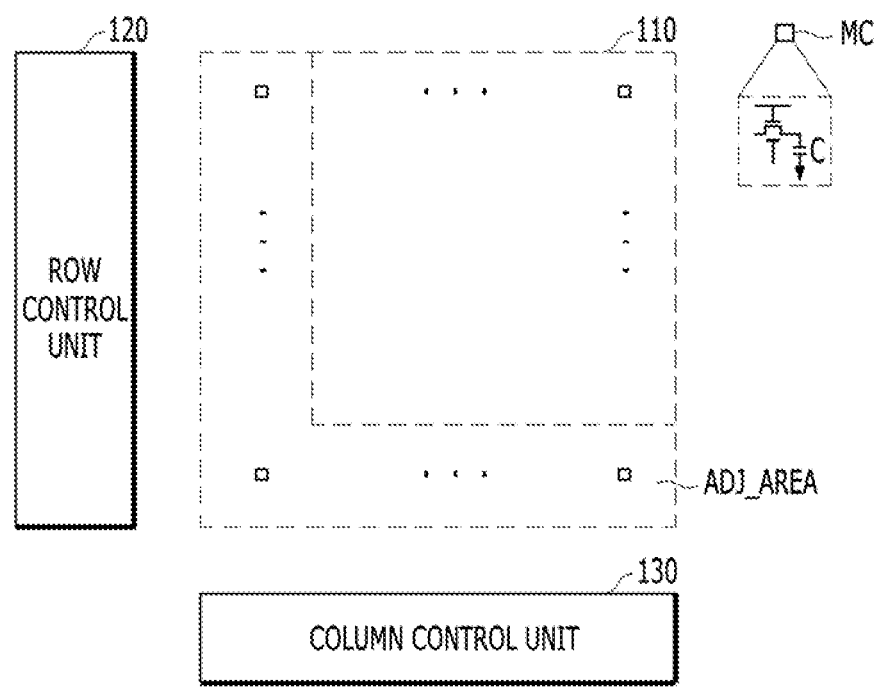
FIG. 1 is a diagram of a memory device having an adjacent area.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It is noted that the drawings are simplified schematics and as such are not necessarily drawn to scale. In some instances, various parts of the drawings may have been exaggerated in order to more clearly illustrate certain features of the illustrated embodiments.

It is further noted that in the following description, specific details are set forth for facilitating the understanding of the present invention, however, the present invention may be practiced without some of these specific details. Also, it is noted, that well-known structures and/or processes may have only been described briefly or not described at all to avoid obscuring the present disclosure with unnecessary well known details.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a diagram describing a memory device having an adjacent area ADJ_AREA.

Accordingly, the memory device of FIG. 1 may include a cell array 110, a row control unit 120 and a column control unit 130.

The cell array 110 may include a plurality of generally parallel, horizontal word lines (not illustrated in FIG. 1), a plurality of generally parallel, vertical bit lines (not illustrated in FIG. 1) and a plurality of iii memory cells MC arranged in a matrix shape. Each of the memory cells MC may be generally positioned at the intersections of the word lines and the bit lines. Each of the memory cells may be operatively coupled to a word line and a bit line. Each of the memory cells MC may include a cell transistor T and a cell capacitor C. The memory cell MC may store data by storing a charge in the cell capacitor C.

The internal operation of the cell array 110 may be performed on a row or column basis. An operation performed on a row basis may be referred to as a row operation. An operation performed on a column basis may be referred to as a column operation. A row operation may include activating a word line, precharging an activated word line, and refreshing a word line. A column operation may include selecting a column to read data and selecting a column to write data. A row operation of the cell array 110 may be controlled by the row control unit 120. A column operation of the cell array 110 may be controlled by the column control unit 130.

The cell array 110 may be divided into a first and a second area, the second area may be referred to as an adjacent area ADJ_AREA. The adjacent area ADJ_AREA may include memory cells MC which are adjacent to the column control circuit and the row control circuit respectively. The first area of the cell array 110 may include all remaining memory cells and may also be referred to as a main area. The memory device may be fabricated by performing a plurality of processes on a semiconductor substrate. Memory cells positioned in the main area may be fabricated through relatively uniform processes, thereby having more uniform, and stable characteristics than memory cells of the adjacent memory area ADJ_AREA. Memory cells of the adjacent memory area ADJ_AREA may also be referred to hereinafter as adjacent memory cells. Adjacent memory cells of the adjacent area ADJ_AREA may not be fabricated through uniform processes and may be, subjected to different processes for fabricating different circuits such as the column control unit 120 and the row control unit 130. Thus, the characteristics of the adjacent memory cells in the adjacent area ADJ_AREA may not be as uniform and stable as the memory cells of the main area of the memory cell array 110. As a result, adjacent memory cells may be more subject to deterioration, when compared to the remaining memory cells of the memory cell array 110 which are positioned in the main area of the memory cell array 110. For example, the data retention times of the adjacent memory cells may be reduced, compared to those of remaining memory cells of the main area of the memory cell array 110. The adjacent memory cells having a shorter data retention time than the remaining memory cells of the main area of the memory cell array or a defined reference time may therefore be "weak cells". Weak adjacent memory cells may cause an error during an operation of the memory device.

Figure 2:
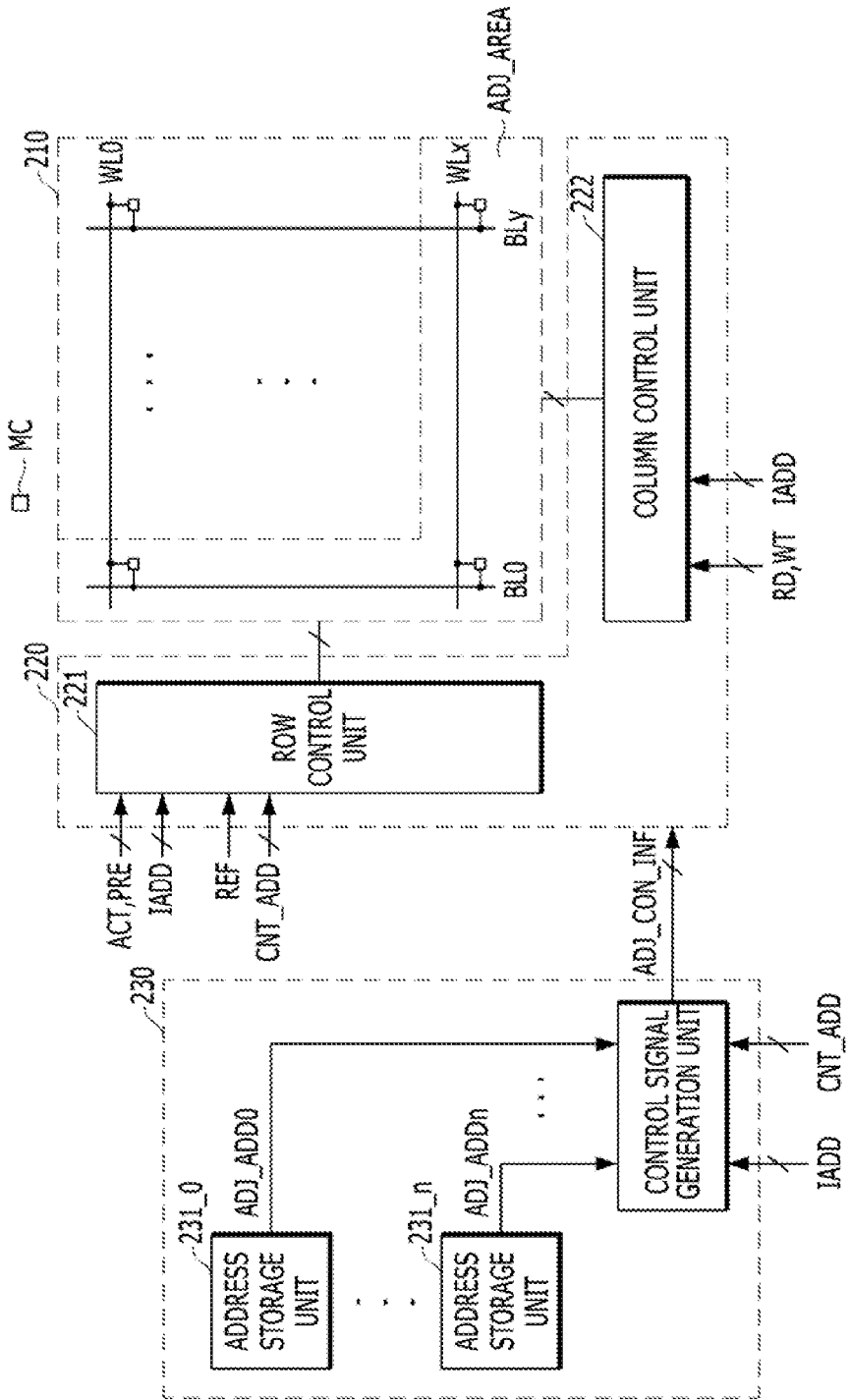
FIG. 2 is a configuration diagram of a memory device, in accordance with an embodiment of the present invention.

FIG. 2 is a configuration diagram of a memory device, in accordance with an embodiment of the present invention.

Referring to FIG. 2, the memory device may include a cell array 210, a control circuit 220 and an adjacent area controller 230.

The cell array 210 may include a plurality of parallel, horizontal word lines WL0 to WLx, a plurality of parallel, vertical bit lines BL0 to BLy, and a plurality of memory cells MC where x and y are natural numbers.

The cell array 210 of the memory device of FIG. 2 may be divided in the same manner as the cell array 110 of the memory device of FIG. 1, into an adjacent area ADJ_AREA and a main area. The adjacent area ADJ_AREA may include memory cells MC which are adjacent to the column control circuit 222 and the row control circuit 221. The main area of the cell array 210 may include all remaining memory cells. The memory cells which are arranged in the adjacent area ADJ_AREA may also be referred as adjacent memory cells.

The control circuit 220 may be arranged adjacent to the cell array 210, and may control the operation of the cell array 210. The control circuit 220 may include a row control unit 221 for controlling a row operation of the cell array 210 and a column control unit 222 for controlling a column operation of the cell array 210. A row operation may include activating a word line, precharging an activated word line, and of refreshing a word line. A column operation may include a read operation of sensing data of a bit line and a write operation of driving a bit line to input data.

The control circuit 220 may activate a word line corresponding to an input address IADD in response to an active command ACT (active operation), precharge an activated word line in response to a precharge command PRE (precharge operation), and refresh a plurality of word lines WL0 to WLx in response to a refresh command REF (refresh operation). During a refresh operation, the row control unit 221 may refresh a word line corresponding to a counting address CNT_ADD. The counting address CNT_ADD may be sequentially counted from an address corresponding to a word line WL0 to an address corresponding to a word line WLx.

The control circuit 220 may sense and output data of a bit line corresponding to an input address IADD in response to a read command RD (read operation), and drive a bit line corresponding to an input address IADD to data to be written (hereafter, referred to as write data), in response to a write command WT (write operation).

The adjacent area controller 230 may control adjacent memory cells arranged in the adjacent area ADJ_AREA among the memory cells MC of the cell array 210, so that the memory cells are operated at a different condition from the remaining memory cells of the main area of the cell array 210. The memory cells which are positioned in the main area of the cell array 210 may also be referred to as main memory cells. FIG. 2 illustrates that the adjacent area ADJ_AREA includes one word line WLx and one bit line BL0. However, the range of the adjacent area ADJ_AREA may be widened or narrowed according to design.

The adjacent area controller 230 may include a plurality of address storage units 231_0 to 231_*n* and a control signal generation unit 232, where n is a natural number. The plurality of address storage units 231_0 to 231_*n* may store the addresses of one or more memory cells included in the adjacent area ADJ_AREA. The plurality of address storage units 231_0 and 231_*n* may output the stored addresses ADJ_ADD0 to ADJ_ADDn. The control signal generation unit 232 may generate adjacent area control information ADJ_CON_INF by comparing the input address IADD or the counting address CNT_ADD to the addresses ADJ_ADD0 to ADJ_ADDn outputted from the address storage units 231_0 to 231_*n*. The adjacent area control information ADJ_CON_INF may include information indicating whether the input address IADD or the counting address CNT_ADD is equal to the addresses ADJ_ADD0 to ADJ_ADDn outputted from the address storage units 231_0 to 231_*n*. The adjacent area control information ADJ_CON_INF may include the addresses ADJ_ADD0 to ADJ_ADDn outputted from one or more address storage units.

The control circuit 220 may control the memory cells MC of the adjacent area ADJ_AREA to operate under a different condition from the main memory cells which are positioned in the main area of the cell array 210, in response to the adjacent area control information ADJ_CON_INF generated by the adjacent area controller 230. The memory cells MC included in the adjacent area ADJ_AREA may operate differently from the main memory cells, in terms of one or more characteristics. Hereafter, referring to FIGS. 3A to 7, an operation of the memory device will be described.

Figure 3A:
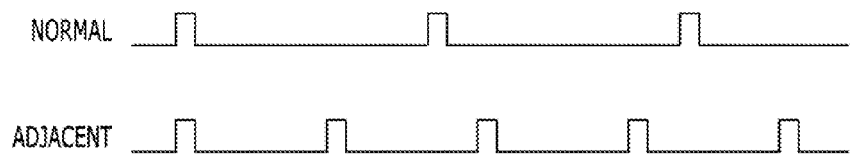
FIGS. 3A and 3B are timing diagrams describing an operation for controlling memory cells of an adjacent area to be refreshed at a higher frequency than the remaining memory cells of the main area of the memory cell array of a memory device in accordance with a first embodiment of the present invention.
Figure 3B:
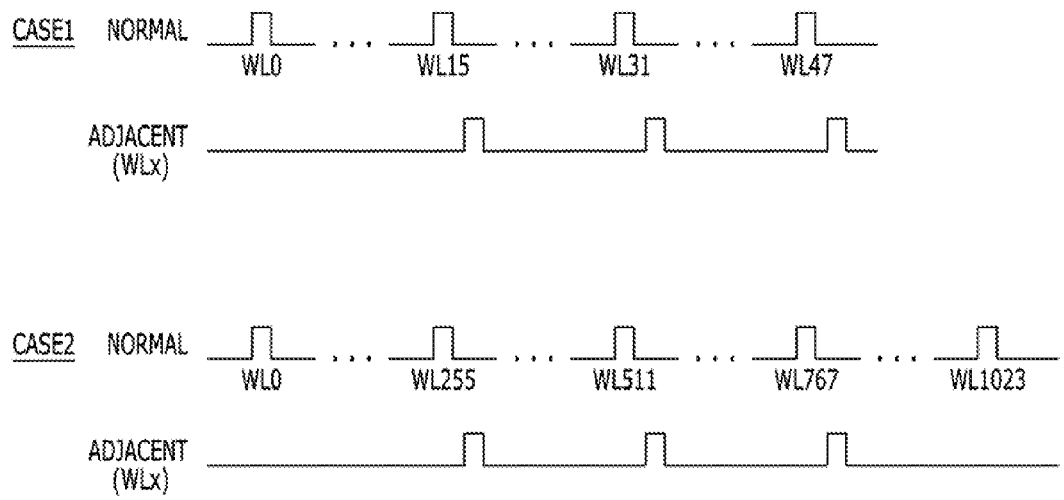

FIGS. 3A and 3B are diagrams describing an operation for controlling memory cells of an adjacent area ADJ_AREA to be refreshed at a higher frequency than the main memory cells disposed in the main area of the memory cell array of a memory device in accordance with a first embodiment of the present invention.

Referring to FIG. 3A, 'ADJACENT' may indicate a cycle at which the memory cells MC of the adjacent area ADJ_AREA are refreshed, and 'NORMAL' may indicate a cycle at which the main memory cells are refreshed. When the memory cells MC of the adjacent area ADJ_AREA are controlled to be refreshed at a higher frequency or shorter cycle than the main memory cells (i.e., the remaining memory cells of cell array 210 which are disposed in the main area of the cell array 210), the memory cells MC of the adjacent area ADJ_AREA may be managed in such a manner that data stored therein are not deteriorated, even though some memory cells among the memory cells MC of the adjacent area ADJ_AREA have a shorter data retention time than the main memory cells.

FIG. 3B is a diagram illustrating a specific method for refreshing the memory cells of the adjacent area ADJ_AREA at a high frequency. In FIG. 3B, CASE1 may indicate an operation of additionally refreshing a word line WLx of the adjacent area ADJ_AREA whenever the refresh command REF is applied a preset number of times (for example, 16). Referring to FIG. 3B, 'NORMAL' may indicate that a word line is refreshed through a basic refresh operation, and 'ADJACENT' may indicate that a word line WLx of the adjacent area ADJ_AREA is additionally refreshed.

In FIG. 3B, CASE2 may indicate an operation of refreshing the word line WLx together when a word line of which the address includes the same bits as partial bits of the address of the word line WLx is refreshed. For example, when the address of the word line WLx is 1111111111 (1023), the word line WLx may be refreshed together in case where a word line having an address of which lower 8 bits are equal to those of the address of the word line WLx, for example, 0011111111 (255), 0111111111 (511) or 1011111111 (767) is refreshed. In addition, the memory cells of the adjacent area ADJ_AREA may be refreshed at a higher frequency than the main memory cells through various methods.

Figure 4A:
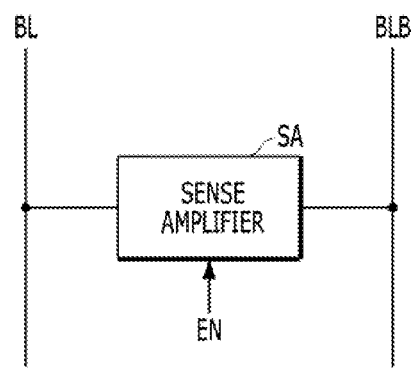
Figure 4B:
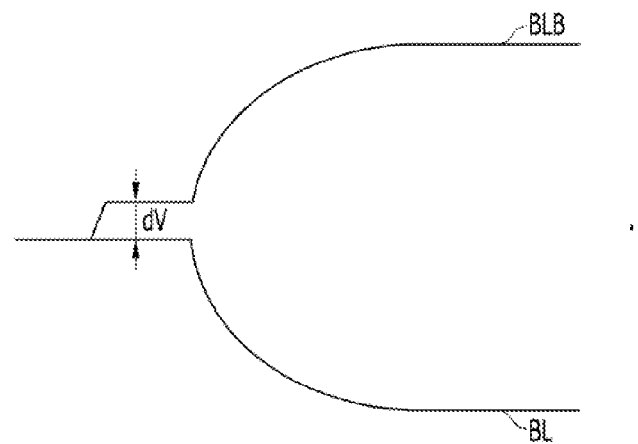

FIGS. 4A to 4C are diagrams describing an operation for controlling memory cells of an adjacent area ADJ_AREA to be sensed at a later point of time than the main memory cells which are disposed in the main area of the cell array of a memory device in accordance with a second embodiment of the present invention.

FIG. 4A is a diagram illustrating a bit line BL, a bit line bar BLB and a sense amplifier SA. Referring to FIG. 4A, the bit line BL and the bit line bar BLB may be coupled to both ends of the sense amplifier SA, and the sense amplifier SA may amplify a potential difference between the bit line BL and the bit line bar BLB. The sense amplifier SA may be enabled in response to an enable signal EN.

FIG. 4B is a diagram illustrating changes in voltage of the bit line/bit line bar BL/BLB during a read operation. Hereafter, the case in which 'high' data are loaded to the bit line bar BLB and 'low' data are loaded to the bit line BL will be taken as an example for description. Referring to FIG. 4B, when a word line is activated during a read operation, the voltage of the bit line bar BLB may rise due to charge sharing with a memory cell MC, and when the sense amplifier SA is enabled, a voltage difference between the bit line BL and the bit line bar BLB may be amplified. For reference, the sense amplifier SA may amplify the voltage difference between the bit line/bit line bar BL/BLB only when the voltage difference between the bit line/bit line bar BL/BLB is equal to or more than a predetermined value (dV).

FIG. 4C is a diagram illustrating changes in voltage of a bit line/bit line bar BL/BLB during a read operation in the memory device of FIG. 2. In FIG. 4C, 'ADJACENT' may indicate changes in voltage of the bit line/bit line bar BL/BLB to which the memory cells MC of a adjacent area ADJ_AREA are coupled, and 'NORMAL' may indicate changes in voltage of a bit line/bit line bar BL/BLB to which the memory cells of the main area of the memory cell array are coupled.

The changes in voltage of the bit line/bit line bar BL/BLB to which the memory cells MC other than the memory cells MC of the adjacent area ADJ_AREA are coupled are almost similar to the changes in voltage of the bit line/bit line bar BL/BLB in FIG. 4B.

Changes in voltage of a bit line/bit line bar BL/BLB to which memory cells having a short data retention time among the memory cells MC of the adjacent area ADJ_AREA are coupled may be slower than in the case of 'NORMAL'. That is because a memory cell having a short data retention time stores a small amount of charge due to charge leakage. Thus, more time may be required until the voltage difference between the bit line/bit line bar BL/BLB becomes equal to or more than a predetermined value (dV). Therefore, in the case of 'ADJACENT' the time from the point of time that the word line is activated (ACTIVE) to the point of time that the sense amplifier SA is enabled (SA_EN) may be increased to normally amplify the data of the bit line/bit line bar BL/BLB. That is, the time may be controlled to satisfy a relation of tADJ>tNOR, so that the memory cells having a short data retention time among the memory cells MC of the adjacent area ADJ_AREA can be normally operated.

Figure 5A:
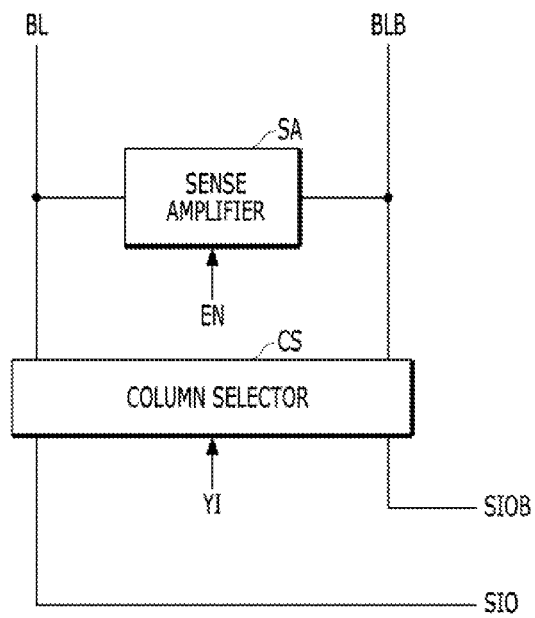
FIGS. 5A to 5C are diagrams describing an operation for controlling memory cells of an adjacent area ADJ_AREA so that a write operation for the memory cells of the adjacent area ADJ_AREA is started at an earlier point of time or is performed for a longer time than a write operation for the memory cells of the main area of the memory cell array, in a memory device in accordance with a third embodiment of the present invention.
Figure 5B:
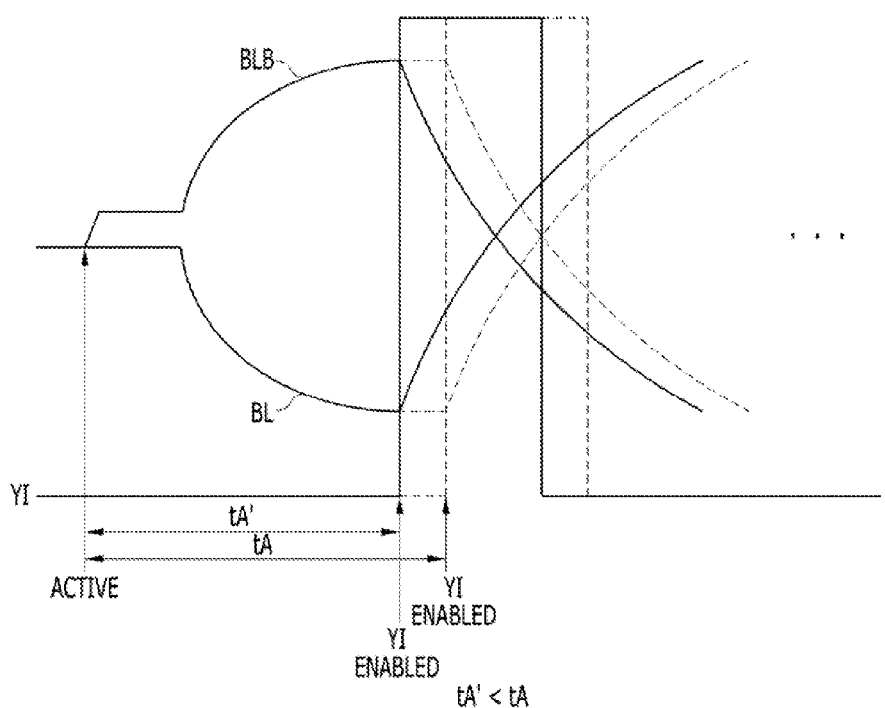
Figure 5C:
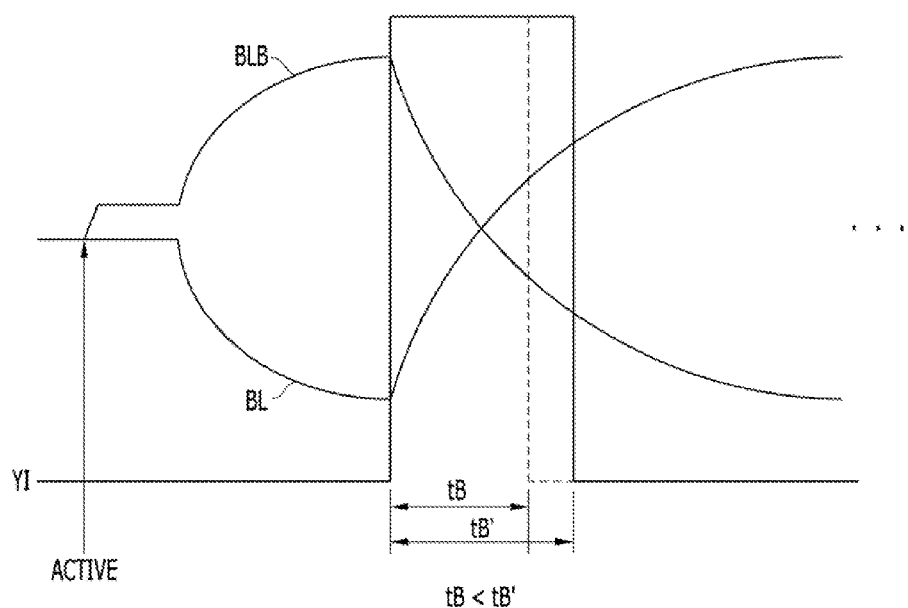

FIGS. 5A to 5C are diagrams describing an operation for controlling memory cells of an adjacent area ADJ_AREA so that a write operation for the memory cells of the adjacent area ADJ_AREA is started at an earlier point of time or is performed for a longer time than a write operation for the memory cells of the main area of the memory cell array, in a memory device in accordance with a third embodiment of the present invention.

FIG. 5A is a diagram illustrating a bit line BL, a bit line bar BLB, a SIO line SIO, a SIO line bar SIOB, a sense amplifier SA and a column selector CS. Referring to FIG. 5A, the column selector CS may electrically couple the bit line/bit line bar BL/BLB to the SIO line/SIO line bar SIO/SIOB when a column select signal YI is enabled.

Hereafter the case in which the bit line bar BLB is driven to 'low' data and the bit line BL is driven to 'high data' for a write operation in a state where 'high' data are loaded to the bit line bar BLB and 'low' data are loaded to the bit line BL will be taken as an example for description.

FIG. 5B is a diagram illustrating changes in voltage of a bit line/bit line bar BL/BLB when a bit line corresponding to the memory cells of the adjacent area ADJ_AREA starts a write operation at an earlier point of time than a bit line corresponding to the memory cells of the main area of the memory cell array during a write operation.

Referring to FIG. 5B, a solid line indicates changes in voltage of a bit line/bit line bar BL/BLB corresponding to the memory cells of the adjacent area ADJ_AREA, and a dotted line indicates changes in voltage of a bit line/bit line bar BL/BLB corresponding to the remaining memory cells of the main area of the memory cell array.

During a write operation, a column select signal YI may be enabled at tA or tA' after a preset time has elapsed since a word line was activated (ACTIVE). When the column select signal YI is enabled, the bit line/bit line bar BL/BLB may start to be driven to write data, and data of the bit line/bit line bar BL/BLB may be written to a memory cell MC. At this time, the point of time that the bit line/bit line bar BL/BLB of the adjacent area ADJ_AREA is driven to write data may be earlier than the point of time that the other bit line/bit line bar BL/BLB is driven to write data (that is, tA'<tA).

When the point of time that the bit line/bit line bar BL/BIB is driven to write data is advanced, the data of the bit line/bit line bar BL/BIB may be changed to write data at an earlier point of time. Thus, the data of the bit line/bit line bar BL/BLB may be written to the memory cell MC for a longer time. With the increase of the time during which data are written to the memory cell MC, a relatively large amount of charge may be stored in the memory cell MC so that the data of the memory cell MC can be retained for a longer time.

FIG. 5C is a diagram illustrating changes in voltage of the bit line/bit line bar BL/BLB when a bit line corresponding to the memory cells of the adjacent area ADJ_AREA is controlled to perform a write operation for a longer time than a bit line corresponding to the memory cells of the main area of the memory cell array, during a write operation.

Referring to FIG. 5C, a solid line indicates changes in voltage of a bit line/bit line bar BL/BLB corresponding to the memory cells of the adjacent area ADJ_AREA, and a dotted line indicates changes in voltage of a bit line/bit line bar BL/BLB corresponding to the memory cells of the main area of the memory cell array.

During a write operation, the column select signal YI may be enabled during a preset period tB or tB', after a preset time has elapsed since a word line was activated (ACTIVE). When the column select signal YI is enabled, the bit line/bit line bar BL/BLB may start to be driven to write data, and data of the bit line/bit line bar BL/BLB may be written to the memory cell MC. At this time, the period during which the bit line/bit line bar BL/BLB of the adjacent area ADJ_AREA is driven to write data may be longer than the period during which the other bit line/bit line bar BL/BLB is driven to write data (that is, tB'>tB).

When the period during which the bit line/bit line BL/BLB is driven to write data is increased, the memory cell MC may be sufficiently driven to write data through a driver (not illustrated in FIG. 5A) coupled to the SIO line/SIO line bar SIO/SIOB for a longer time, and a relatively large amount of charge may be stored in the memory cell MC so that the data of the memory cell MC can be retained for a longer time.

Figure 6:
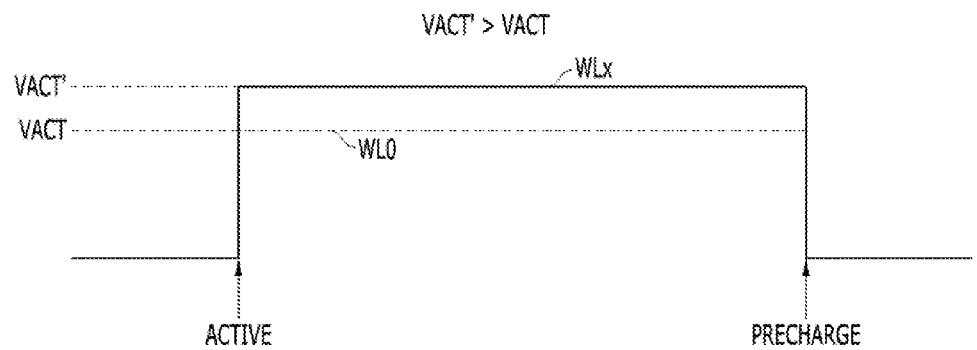
FIG. 6 is a diagram describing an operation for driving one or more word lines of an adjacent area to a higher voltage than the main area word lines of a memory device during a refresh operation, in accordance with an embodiment of the present invention.

FIG. 6 is a diagram describing an operation for controlling one or more word lines WLx of an adjacent area ADJ_AREA to be driven to a higher voltage than the main area word lines WL0 controlling main area memory cells during a refresh operation, in a memory device in accordance with an embodiment of the present invention.

Referring to FIG. 6, a solid line indicates a voltage change of the word line WLx of the adjacent area ADJ_AREA, and a dotted line indicates a voltage change of one of the main area word lines (for example, WL0).

During a refresh operation, when a word line is activated in response to a refresh command REF (ACTIVE), a memory cell MC and a bit line/bit line bar BL/BLB may be electrically coupled, and data of the memory cell MC may be rewritten by the sense amplifier SA. At this time when a voltage level VACT' at which the word line WLx of the adjacent area ADJ_AREA is activated is raised to a higher level than a voltage level VACT at which the word line WL0 is activated, a relatively large amount of charge may be stored in the memory cell MC coupled to the word line WLx so that the data of the memory cell MC can be retained for a longer time. The activated word line may be precharged after a preset time has elapsed.

Figure 7:
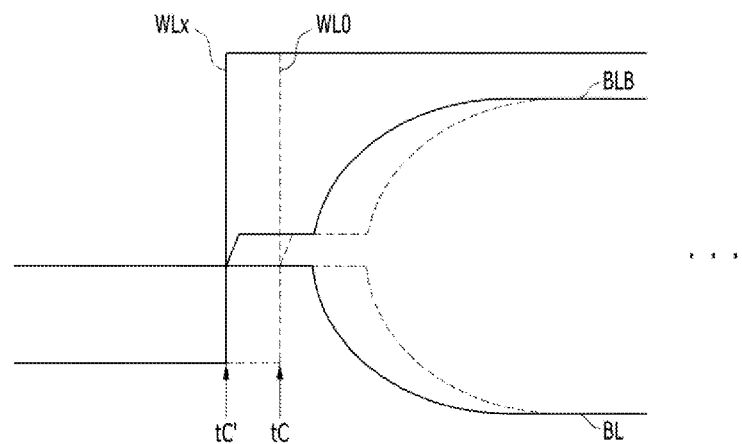
FIG. 7 is a diagram describing an operation for driving one or more word lines of an adjacent area at an earlier point of time than the main area word lines of a memory device during a refresh operation, in accordance with an embodiment of the present invention.

FIG. 7 is a diagram describing an operation for controlling one or more word lines WLx of an adjacent area ADJ_AREA to be driven at an earlier point of time than the main area word lines WL0 during a refresh operation, in a memory device in accordance with an embodiment of the present invention.

Referring to FIG. 7, a solid line indicates changes in voltage of the word line WLx of the adjacent area ADJ_AREA and a bit line/bit line bar BL/BLB, and a dotted line indicates changes in voltage of one of the main area word lines (for example, WL0) and a bit line/bit line bar BL/BLB.

During a refresh operation when a word line is activated in response to a refresh command REF (ACTIVE), a memory cell MC and the bit line/bit line bar BL/BLB may be electrically coupled to each other, and data of the memory cell MC may be rewritten by the sense amplifier SA. At this time, when a time point tC' that the word line WLx of the adjacent area ADJ_AREA is controlled to be activated earlier than a time point tC that the word line WL0 is activated, a relatively large amount of charge may be stored in the memory cell MC coupled to the word line WLx so that the data of the memory cell MC can be retained for a longer time.

The memory device of FIG. 2 may operate the memory cells MC of the adjacent area ADJ_AREA under a different condition from the remaining memory cells of the main area of the memory cell array in terms of various aspects, so that a weak cell which is highly likely to exist in the adjacent area ADJ_AREA does not cause an error during the operation of the memory device. FIG. 3A to 7 illustrate the operating methods in accordance with various embodiments. However the memory device of FIG. 2 may control the memory cells MC of the adjacent area ADJ_AREA through a combination of one or more of the embodiments. For example, 31 combinations can be created through the embodiments.

The memory device of FIG. 2 may not separately test and detect a weak cell, but may operate memory cells MC within a preset range from the control circuit 220 under a specific condition, based on the characteristic that the memory cells MC adjacent to the control circuit 220 are more highly likely to be deteriorated than the remaining memory cells of the cell array which are disposed in the main area of the cell array. Thus, a memory device, according to various embodiments of the present invention can solve a problem which may occur due to a weak adjacent memory cell, without detecting a weak cell. Therefore, the memory device of FIG. 2 does not require a circuit for detecting a weak cell.

Figure 8:
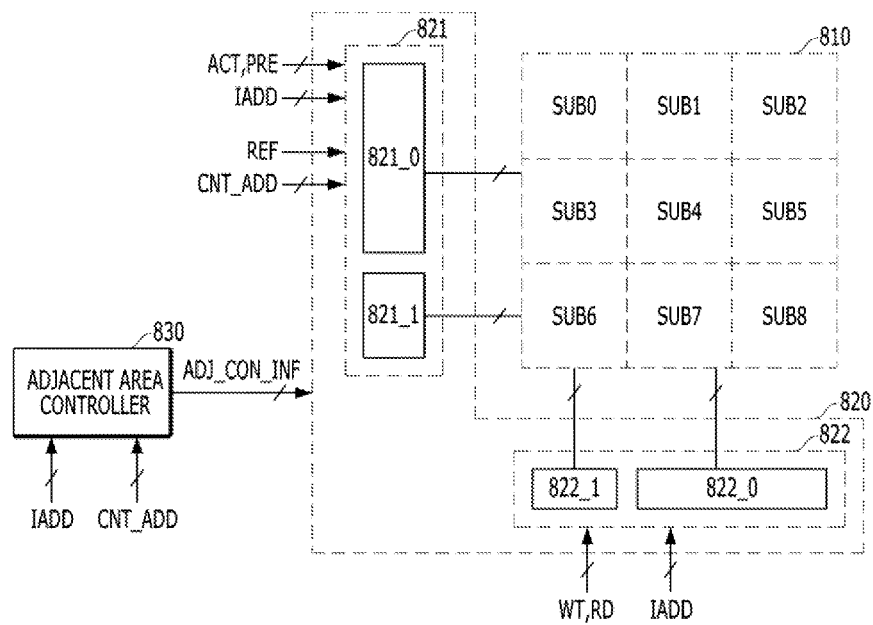
FIG. 8 is a configuration diagram of a memory device, in accordance with an embodiment of the present invention.
Figure 9:
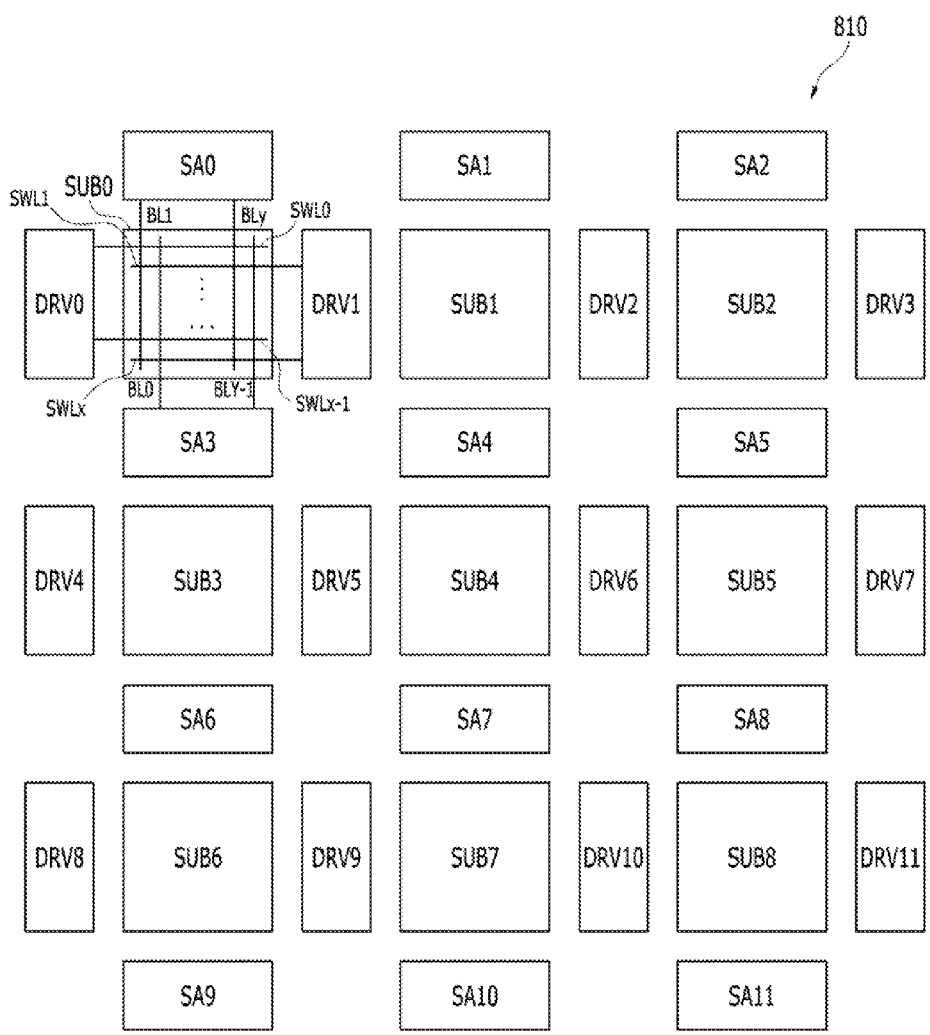
FIG. 9 is a configuration diagram of a cell array.

FIG. 8 is a configuration diagram of a memory device in accordance with an embodiment of the present invention. FIG. 9 is a configuration diagram of the cell array of the memory device of FIG. 8.

Referring to FIG. 8, the memory device may include a cell array 810, a control circuit 820 and an adjacent area controller 830. The memory device of FIG. 8 has almost the same configuration as the memory device of FIG. 2, except that the cell array 810 includes a plurality of sub cell arrays SUB0 to SUB8 arranged in a matrix shape. FIG. 8 illustrates that the cell array 810 include nine sub cell arrays SUB0 to SUB8, but the cell array 810 may include dozens to tens of thousands of sub cell arrays 810 according to design. The control circuit 820 may include a row control unit 821 for controlling a row operation and a column control unit 822 for controlling a column operation.

The control circuit 820 may separate components 821_0 and 822_0 for controlling sub cell arrays SUB1, SUB2, SUB4 and SUB5 and components 821_1 and 822_1 for controlling sub cell arrays SUB0, SUB3 and SUB6 to SUB8 which are adjacent to the control circuit 820 in order to operate the sub cell arrays SUB0, SUB3 and SUB6 to SUB8 adjacent to the control circuit 820 under a different condition from the other sub cell arrays SUB1, SUB2, SUB4 and SUB5.

Referring to FIG. 9, the cell array 810 may include the plurality of sub cell arrays SUB0 to SUB8, a plurality of sense amplifiers SA0 to SA11 and a plurality of sub word line drivers DRV0 to DRV11.

The sub cell array SUB0 may include a plurality of sub word lines SWL0 to SWLx, a plurality of bit lines BL0 to BLy, and a plurality of memory cells MC (not illustrated in FIG. 9) which are coupled to the bit lines and the sub word lines, where x and y are natural numbers. Although the internal configurations of the other sub cell arrays SUB1 to SUB8 are omitted, the other sub cell arrays SUB1 to SUB8 may have the same configuration as the sub cell array SUB0.

The plurality of sense amplifiers SA0 to SA11 may be enabled to sense and amplify the voltage of a selected bit line among the plurality of bit lines. When a corresponding sub word line among the plurality of sub word lines is selected during an active operation or refresh operation, each of the sub word line drivers DRV0 to DRV11 may activate or precharge the selected sub word line. The plurality of sense amplifiers SA0 to SA11 and the plurality of sub word line drivers DRV0 to DRV11 may be operated according to control of the control circuit 820.

Referring now again to FIG. 8, the adjacent area controller 830 may store addresses corresponding to part or all of memory cells included in the sub cell arrays SUB0, SUB3 and SUB6 to SUB8. The adjacent area controller 830 may control all or part of the memory cells included in the sub cell arrays SUB0, SUB3 and SUB6 to SUB8 arranged in an area adjacent to the control circuit 820 among the sub cell arrays SUB0 to SUB9 so that all or part of the memory cells are operated under a different condition from memory cells included in the other sub cell arrays SUB1, SUB2, SUB4 and SUB5.

In a memory device in accordance with an embodiment, the adjacent area controller 830 may refresh all or part of the plurality of sub word lines of one or more sub cell arrays SUB0, SUB3 and SUB6 to SUB8 adjacent to the control circuit 820 among the sub cell arrays at a higher frequency than the other sub word lines.

In a memory device in accordance with an embodiment, the adjacent area controller 830 may control all or part of the plurality of bit lines of one or more sub cell arrays SUB0, SUB3 and SUB6 to SUB8 adjacent to the control circuit 820 among the sub cell arrays so that all or part of the plurality of bit lines start to be sensed at a later point of time than the other bit lines, during a read operation.

In a memory device in accordance with an embodiment, the adjacent area controller 830 may control all or part of the plurality of bit lines of one or more sub cell arrays SUB0, SUB3 and SUB6 to SUB8 adjacent to the control circuit 820 among the sub cell arrays, so that all or part of the plurality of bit lines start to be driven at an earlier point of time or are driven for a longer time than the other bit lines, during a write operation.

In a memory device in accordance with an embodiment, the adjacent area controller 830 may control all or part of the plurality of sub word lines of one or more sub cell arrays SUB0, SUB3 and SUB6 to SUB8 adjacent to the control circuit 820 among the sub cell arrays, so that all or part of the plurality of sub word lines are driven to a higher voltage than the other sub word lines, during a refresh operation.

In a memory device in accordance with an embodiment, the adjacent area controller 830 may control all or part of the plurality of sub word lines of one or more sub cell arrays SUB0, SUB3 and SUB6 to SUB8 adjacent to the control circuit 820 among the sub cell arrays, so that all or part of the plurality of sub word lines start to be driven at an earlier point of time than the other sub word lines, during a refresh operation.

The cell array of the memory device of FIG. 8 may be sub-divided into the sub cell arrays SUB0 to SUB8, unlike the memory device of FIG. 2. Furthermore, the components SA0 to SA11 and DRV0 to DRV11 for controlling the sub cell arrays SUB0 to SUB9 may also be sub-divided. Thus, the sub cell arrays SUB0, SUB3 and SUB6 to SUB8 adjacent to the control circuit 820 among the sub cell arrays SUB0 to SUB8 can be controlled independently of the other sub cell arrays SUB1, SUB2, SUB4 and SUB5. Through this operation, the memory cells adjacent to the control circuit 820 can be more precisely managed.

Figure 10:
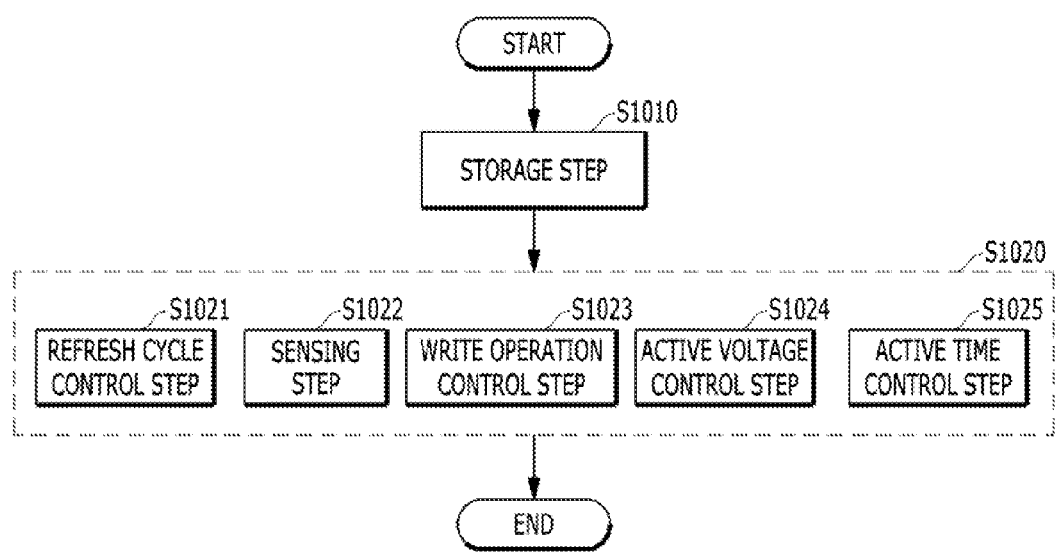
FIG. 10 is a diagram describing a method for operating a memory device in accordance with an embodiment of the present invention.

FIG. 10 is a diagram describing a method for operating a memory device, in accordance with an embodiment of the present invention.

Referring to FIG. 10, the method for operating a memory device may include a storage step S1010 and a control step S1020.

The storage step S1010 may include setting the range of an adjacent area, and storing the addresses of memory cells included in the adjacent area. For example, the addresses of the memory cells of the adjacent area may be stored in a nonvolatile memory circuit. The nonvolatile memory circuit may include one of nonvolatile memory circuits such as a fuse circuit, a Read Only Memory (ROM), a NOR Flash Memory, a NAND Flash Memory, a Phase-Change Random Access Memory (PRAM), a Resistive Random Access Memory (RRAM), a Spin Transfer Torque Random Access Memory (STTRAM) and a Magnetic Random Access Memory (MRAM) or one of various circuits which store data by performing a similar function to the nonvolatile memory circuit.

The control step S1020 may include operating the memory cells of the adjacent area under a different condition from the remaining memory cells of the memory cell array which are disposed in the main area of the memory cell array, and using the addresses stored at the storage step S1010. The control step S1020 may include one or more control steps among the following control steps.

The first control step may be a refresh cycle control step S1021 of refreshing the memory cells of the adjacent area at a higher frequency than the remaining memory cells of the main area of the memory cell array. The second control step may be a sensing control step S1022 for controlling the memory cells of the adjacent area to start to be sensed at a later point of time than the memory cells of the main area of the memory cell array, during a read operation. The third control step is a write operation control step S1023 for controlling the memory cells of the adjacent area so that a write operation for the memory cells is started at an earlier point of time than the memory cells of the main area of the memory cell array. The fourth control step is an active voltage control step S1024 of activating word lines or sub word lines corresponding to the memory cells of the adjacent area to a higher voltage than word lines or sub word lines corresponding to the memory cells of the main area of the memory cell array, during a refresh operation. The fifth control step is an active time control step S1025 for controlling word lines or sub word lines corresponding to the memory cells of the adjacent area so that the word lines or sub word lines start to be driven at an earlier point of time than word lines or sub word lines corresponding to the memory cells of the main area of the memory cell array, during a refresh operation.

In accordance with the various described embodiments, a memory device and a method for controlling the same are provided that can operate memory cells of an adjacent area of the cell array under a different condition from the remaining memory cells of the cell array which are in a main area of the memory cell array, thereby reducing an error which may occur in the adjacent area due to a weak cell which is more likely to exist in the adjacent area rather than in the main area of the cell array.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
a cell array comprising a main area and an adjacent area with a plurality of main memory cells disposed in the main area and a plurality of adjacent memory cells disposed in the adjacent area;
a control circuit suitable for controlling a row operation and column operation of the cell array; and
an adjacent area controller suitable for controlling adjacent memory cells so that the adjacent memory cells are operated under a different condition from the main memory cells,
wherein the adjacent memory cells are disposed adjacent the control circuit and the adjacent area controller stores the addresses of the adjacent memory cells.

2. The memory device of claim 1, wherein the adjacent area controller controls the adjacent memory cells so that the adjacent memory cells are refreshed at a higher frequency than the main memory cells.

3. The memory device of claim 1, wherein the adjacent area controller controls the adjacent memory cells so that the adjacent memory cells start to be sensed at a later point of time than the main memory cells.

4. The memory device of claim 1, wherein the adjacent area controller controls the adjacent memory cells, so that a write operation for the adjacent memory cells is started at an earlier point of time or performed for a longer time than a write operation for the main memory cells.

5. The memory device of claim 1, wherein the cell array comprises:
a plurality of word lines; and
a plurality of bit lines.

6. The memory device of claim 5, wherein the adjacent area controller controls one or more word lines arranged in the area adjacent to the control circuit among the plurality of word lines, so that the one or more word lines are driven to a higher voltage than the main area word lines, during a refresh operation.

7. The memory device of claim 5, wherein the adjacent area controller controls one or more word lines arranged in the area adjacent to the control circuit among the plurality of word lines, so that the one or more word lines start to be driven at an earlier point of time than the main area word lines, during a refresh operation.

8. A memory device comprising:
a cell array comprising a plurality of sub cell arrays arranged in a matrix shape;
a control circuit suitable for controlling a row operation and column operation of the cell array; and
an adjacent area controller suitable for controlling all or part of memory cells included in sub cell arrays, which are arranged in an area adjacent to the control circuit, among the sub cell arrays, such that all or part of the memory cells are operated under a different condition from memory cells included in the other sub cell arrays,
wherein the adjacent area controller stores the addresses of the memory cells included in the sub cell arrays, which are arranged in the area adjacent to the control circuit.

9. The memory device of claim 8, wherein each of the sub cell arrays comprises:
a plurality of sub word lines; and
a plurality of bit lines.

10. The memory device of claim 9, wherein the control circuit comprises:
a row control unit suitable for controlling the row operation of the cell array; and
a column control unit suitable for controlling the column operation of the cell array.

11. The memory device of claim 10, wherein the adjacent area controller controls all or part of the plurality of sub word lines of one or more sub cell arrays adjacent to the control circuit among the sub cell arrays, so that all or part of the plurality of sub word lines are refreshed at a high frequency than the other sub word lines.

12. The memory device of claim 10, wherein the adjacent area controller controls all or part of the plurality of sub word lines of one or more sub cell arrays adjacent to the control circuit among the sub cell arrays, so that all or part of the plurality of sub word lines are driven to a higher voltage than the other sub word lines, during a refresh operation.

13. The memory device of claim 10, wherein the adjacent area controller controls all or part of the plurality of sub word lines of one or more sub cell arrays adjacent to the control circuit among the sub cell arrays, so that all or part of the plurality of sub word lines start to be driven at an earlier point of time than the other sub word lines, during a refresh operation.

14. The memory device of claim 10, wherein the adjacent area controller controls all or part of the plurality of bit lines of one or more sub cell arrays adjacent to the control circuit among the sub cell arrays, so that all or part of the plurality of bit lines start to be sensed at a later point of time than the other bit lines, during a read operation.

15. The memory device of claim 10, wherein the adjacent area controller controls all or part of the plurality of bit lines of one or more sub cell arrays adjacent to the control circuit among the sub cell arrays, so that all or part of the plurality of bit lines start to be driven at an earlier point of time or is driven for a longer time than the other bit lines, during a write operation.

16. A method for operating a memory device which includes a cell array including a plurality of memory cells, a control circuit for controlling a row operation and column operation of the cell array, and an adjacent area controller for controlling all or part of memory cells, the method comprising:
by the adjacent area controller, storing addresses of memory cells, which are arranged in an area adjacent to the control circuit, among the plurality of memory cells; and
by the adjacent are controller, controlling the memory cells, which are arranged in the area adjacent to the control circuit, so that the memory cells are operated under a different condition from the remaining memory cells of the memory cell array.

17. The method of claim 16, wherein the controlling of the memory cells comprises controlling the memory cells arranged in the area adjacent to the control circuit, so that the memory cells are refreshed at a higher frequency than the remaining memory cells the memory cell array.

18. The method of claim 16, wherein the controlling of the memory cells comprises controlling the memory cells arranged in the area adjacent to the control circuit, so that the memory cells start to be sensed at a later point of time than the remaining memory cells of the memory cell array, during a read operation.

19. The method of claim 16, wherein the controlling of the memory cells comprises controlling the memory cells arranged in the area adjacent to the control circuit, so that a write operation for the memory cells is started at an earlier point of time or performed for a longer time than a write operation for the remaining memory cells of the memory cell array, during a write operation.

20. A memory device comprising:
a cell array including a plurality of first and second memory cells;
a control circuit configured to control a row operation and column operation of the cell array; and
an adjacent area controller configured to control the plurality of second memory cells, so that the plurality of second memory cells are operated under a different condition from the plurality of first memory cells,
wherein the plurality of second memory cells are disposed between the control circuit and the plurality of first memory cells, and
wherein the adjacent area controller stores the addresses of the memory cells included in the second memory cells, which are arranged in the area adjacent to the control circuit.

* * * * *